United States Patent [19]

Fujiyama

[11] Patent Number: 4,633,812
[45] Date of Patent: Jan. 6, 1987

[54] VACUUM PLASMA TREATMENT APPARATUS

[75] Inventor: Yasutomo Fujiyama, Kawasaki, Japan

[73] Assignee: Canon Kabushiki Kaisha, Tokyo, Japan

[21] Appl. No.: 699,870

[22] Filed: Feb. 8, 1985

[30] Foreign Application Priority Data

Feb. 13, 1984 [JP] Japan .................................. 59-24633

[51] Int. Cl.⁴ ............................................. C23C 13/08
[52] U.S. Cl. ................................... 118/723; 118/50.1;
156/345; 156/643
[58] Field of Search ....................... 118/723, 50.1, 733;
427/39, 38; 156/345, 643; 174/137 B

[56] References Cited

U.S. PATENT DOCUMENTS

| | | | |
|---|---|---|---|
| 3,121,035 | 2/1964 | Heinze | 174/137 B |
| 4,399,016 | 8/1983 | Tsukada et al. | 118/723 X |
| 4,419,201 | 12/1983 | Levinstein et al. | 156/345 X |
| 4,491,496 | 1/1985 | Laporte et al. | 156/345 |
| 4,491,606 | 1/1985 | Rosler et al. | 118/723 X |

Primary Examiner—Richard Bueker
Attorney, Agent, or Firm—Fitzpatrick, Cella, Harper & Scinto

[57] ABSTRACT

An improvement in a vacuum plasma treating apparatus having a reaction chamber partly formed of electric insulating material subject to corrosion by a fluorine or chlorine containing gas plasma, which improvement being that the electric insulating material subject to corrosion comprises a sintered ceramic material containing alumina as a primary ingredient.

2 Claims, 1 Drawing Figure

VACUUM PLASMA TREATMENT APPARATUS

BACKGROUND OF THE INVENTION

1. Field of the Invention

This invention relates to a vacuum plasma treatment apparatus which may be used for various treatments such as etching, formation of a deposition film, cleaning and the like.

2. Description of the Prior Art

As an electric insulating material for a vapor phase method treatment apparatus using gas plasma, the material which is chemically and thermally stable and which releases gas as little as possible under vacuum condition is desired.

As an electric insulating material used as a member constituting a vacuum treatment apparatus for fabricating a semiconductor device, it is essential that the material has an airtight property such that a leak does not occur.

Accordingly, the electric insulating material for the vacuum treatment apparatus in which high vacuum is required for fabricating a semiconductor or the like is generally a quartz ($SiO_2$) ceramic.

In the vapor phase method treatment apparatus, also, quartz ceramics are often used as the material constituting a gas-releasing pipe for supplying a starting gas for formation of a film under the plasma atmosphere, a window, and a reaction chamber, let alone an insulator.

However, in the case where a silicon wafer is etched and patterned using a chlorocarbon or fluorocarbon type gas such as $CF_4$ and the like as an etching gas in the vacuum treatment apparatus using these quartz ceramics, the surface of the material comprising the quartz ceramic exposed to the plasma atmosphere will be corroded by a fluorine radical or the like formed in the plasma.

This corrosion is carried on by chemical reactions between silicon as a construction element of the quartz ceramics and the fluorine radical from the plasma and the consequent production of silicon tetrafluoride ($SiF_4$).

Such corrosion in the vapor phase method treatment apparatus causes undesirable etching by adhesion of corrosion powder onto an etching-receiving surface as well as problems in capacity of the apparatus such as a lowering of electric insulating property of the insulator, a gas leak from a gas releasing pipe, a lowering of translucent property of the material constituting the window, a lowering of a vacuum degree by the leak and the like.

Some of the conventional apparatuses utilize an organic compound such as polytetrafluoroethylene and the like, in which case there also arises the problem of the change in shape due to the corrosion, as is the case with quartz ceramics.

SUMMARY OF THE INVENTION

As object of the present invention is to solve problems on apparatuses in the prior art and to provide a vacuum plasma treatment apparatus in which corrosion is prevented under plasma atmosphere of fluorine compound gas.

According to the present invention, there is provided a vacuum plasma treatment apparatus comprising carrying out a plasma treatment by exposing a treatment-receiving material to gas plasma atmosphere, characterized in that a sintered dielectric material containing alumina constitutes the portion of an electric insulating material to be exposed to the plasma atmosphere which carrys one step of a supply process of electric power supplied for making the plasma atmosphere.

DESCRIPTION OF THE PREFERRED EMBODIMENTS

Figure 1:
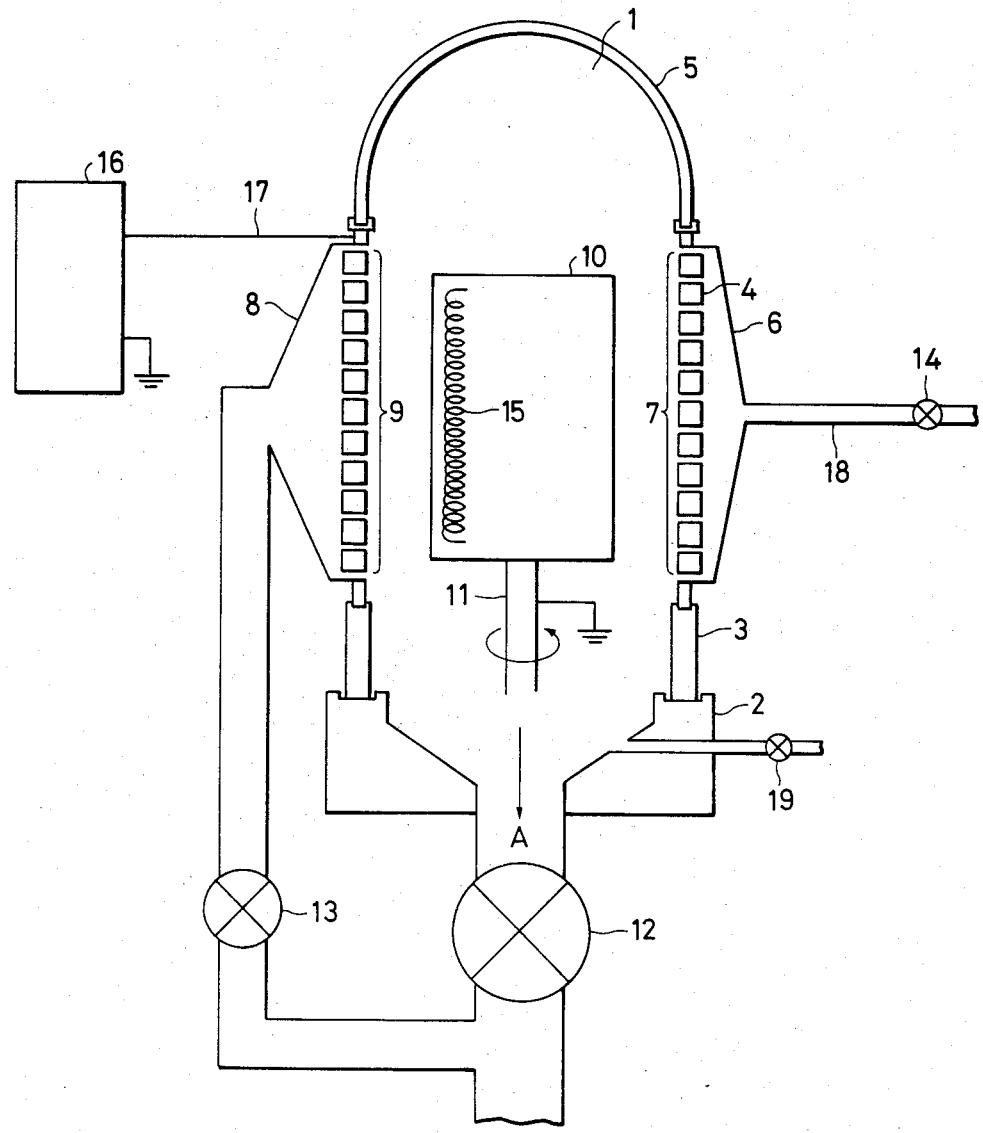
FIG. 1 is a view for illustrating schematically a preferable embodiment of an apparatus according to the present invention.

FIG. 1 shows a film forming apparatus by a glow discharge.

Deposition chamber 1 which may be subjected to reduced pressure is manufactured by placing successively base plate 2 having a construction similar to that used in the general glow discharge deposition apparatus, electric insulating ring 3, cylindrical metal electrode 4 and electric insulating top through O ring, respectively.

Electric insulating ring 3 and electric insulating top cover 5 comprise a sintered dielectric material containing alumina. Electric insulating top cover 5 comprises preferably a transparent ceramic material to facilitate observation of the treatment state in deposition chamber 1.

Metal electrode 4 is provided with an inlet part 6 for gas stream for the purpose of introducing starting gas for a film formation, if necessary in the form mixed with a diluting gas as well as an outlet part 8 for gas stream in order to exhaust gas from the deposition chamber 1. The inlet part 6 includes one or more inlet 7 having a predetermined conductance. The outlet part 8 contains one or more outlet 9 having a predetermined conductance. The inlet part 6 and outlet part 8 are arranged in a positional relationship of a substantial rotation symmetry with the central axis of the metal electrode 4 as the rotation axis.

Support 10 for forming a film is held on fixing member 11 placed at the predetermined position in deposition chamber.

Fixing member 11 is designed so as to revolve on its axis center for forming a uniform film over a whole surface on which the film is formed. In the case where support 10 does not have electric conductivity, fixing member 11 is grounded electrically to serve as another electrode.

In the case where support 10 is for example, a metal drum of an electrophotographic photosensitive member, support 10 as the other electrode is connected electrically with fixing member 11 or fixing member 11 may be grounded electrically or support 10 may be directly grounded electrically without fixing member 11 being connected therewith. Main valve 12 may be opened and shut for exhausting the gas in deposition chamber 1 when starting the film formation. Auxiliary valve 13 is to exhaust the gas in deposition chamber 1 to the outside through the outlet part 8 during the film formation. When introducing the predeterminded gas to deposition chamber 1 from a cylinder (not shown in FIG. 1), valve 14 is opened and shut and also has a function for controlling the gas flow rate. During the film formation, main valve 12 is shut to uniform the gas flow rate and the gas flow velocity in deposition chamber 1 and auxiliary valve and valve 14 are suitably controlled to take the desired gas flow rate and gas flow velocity. Heater 15 is used to maintain the predetermined temperature of support 10 during the film formation or before and after the film formation. Metal electrode 4 is connected with high frequency power source 16 for generating the glow discharge in deposition chamber 1 and one of the terminal of high frequency power source 16 is grounded as shown in the figure or connected with support 10 and/or fixing member 11 to serve as another electrode. Support 10 is revolved on center of fixing member 11 at the predetermined revolution rate during the film formation in order to avoid partiality of discharge strength in the place as much as possible.

Thus, by revolving support 10 on center of fixing member 11 during the film formation, the discharge strength may be distributed uniformly. Thereby, the film having physically uniform property and uniform thickness may be formed on support 10. 17 is a lead wire for supplying electric power. 18 is a gas introducing pipe for a film formation. 19 is a leak valve for leaking the gas in the deposition chamber 1.

As described above, the portion of the electric insulating material exposed to the plasma on the inside of the vacuum plasma treatment apparatus comprises a sintered dielectric material containing alumina as a main ingredient. Thereby, in the present invention, unsatisfactory etching or undesirable formation of a pinhole in the deposition film is prevented by suppressing occurrence of dust by corrosion while preventing the corrosion and metamorphosis of the constituent material and preventing production of $SiF_4$ or the like.

As a fluorine compound gas used in the apparatus of the present invention, there is used carbon fluoride type gas such as $CF_4$, $CHF_3$, $C_2F_6$, $C_3F_8$, $CBrF_3$ and the like known as a gas for a dry etching, polyhalogenide gas such as $SF_6$ and the like, and, if desired, a mixture of fluorine compound gas and oxygen gas.

Practically used embodiments of the conventional vacuum plasma treatment apparatus having the constitution material of the quartz ceramics and the apparatus according to the present invention are illustrated as follows.

Using the conventional apparatus in which a portion of an inner member such as a vaccum chamber, a high frequency electrode and the like is constituted of the quartz ceramics or Teflon.

First of all, the vacuum chamber was evacuated to an inner pressure of from $10^{-2}$ Torr to $10^{-1}$ Torr, a mixed gas of $CF_4$ gas and $O_2$ gas was introduced thereto and then the high frequency of 13.56 MHz from a high frequency power source was introduced to generate a plasma.

A silicon film as an etching-receiving material placed into a plasma atmosphere was etched with fluorine radical particle taken place by a plasma reaction of ($CF_4+O_2$) mixed gas. A gas such as silicon tetrafluoride ($SiF_4$) produced thereby was exhausted to outside of the plasma chamber by a mechanical booster pump and rotary pump. As described above, an etching processing was accomplished.

In this case, the surface of the constitution material of the quartz ceramics or Teflon exposed to the plasma atmosphere reacted with the fluorine radical particle taken place in the plasma. While a vaporized $SiF_4$ gas was produced thereby, the surface was corroded and became porous to decrease its mechanical strength. Also, a powder from some portion of the surface caused a dust.

Especially, the surface of the constitution material of Teflon had a considerable degree of deformation and defect in one portion thereof due to corrosion and vaporization caused by a plasma heating effect in addition to the above-mentioned effect with the result that it was brought to a state of retaining no vestige of its original form.

Light transmission of the transparent quartz ceramics used as the material of the window was extremely lowered by the corrosion. Thereby, the window become of no use.

Alternatively, the etching processing as described above was accomplished using the vaccum plasma treatment apparatus of the present invention which comprises the constitution material constituted of an alumina ceramics in place of the quartz ceramics or Teflon used above and the transparent alumina ceramics as the material constituting the window.

In this case, the constituent material, that is, the material constituted of the alumina ceramics, was not corroded practically and this apparatus showed very high corrosion resistance to a fluorine type corrosive gas.

As explained above, the corrosion and the metamorphosis of the constituent material in the vaccum plasma treatment apparatus using a chemical reaction of a fluorine type compound gas are inhibited by using the sintered dielectric material selected from the sintered ceramics containing alumina as the main ingredient. The quality of these constituent material, that is, the electric insulating property or the mechanical strength, the airtight property, the transparent property or the like, may be maintained for a long period and contributes to maintenance of performance of the said apparatus.

Also, the apparatus according to the present invention comprises the material which may inhibit the generation of the dust by the corrosion and contributes to improvement in a yield of a product.

What is claimed is:

1. In a vaccum plasma treating apparatus having a reaction chamber formed at least in part of electric insulating material subject to corrosion by a fluorine or chlorine containing gas plasma, the improvement wherein the electric insulating material subject to corrosion comprises a sintered ceramic material containing alumina as a primary ingredient.

2. The apparatus of claim 1 in which the reaction chamber includes a base plate, an electric insulating side ring on said base plate, sidewalls having gas inlet and gas outlet parts on said side ring, and an electric insulating top cover with a transparent viewing window on said sidewalls, wherein the electric insulating side ring and top cover with transparent viewing window are formed of said sintered ceramic material containing alumina as a primary ingredient.

* * * * *

UNITED STATES PATENT AND TRADEMARK OFFICE
CERTIFICATE OF CORRECTION

PATENT NO. : 4,633,812

DATED : January 6, 1987

INVENTOR(S) : YASUTOMO FUJIYAMA

Page 1 of 2

It is certified that error appears in the above-identified patent and that said Letters Patent is hereby corrected as shown below:

COLUMN 1

Line 48, "gas releasing" should read --gas-releasing--.

COLUMN 2

Line 3, "carrys" should read --carries--.
Line 42, "chamber." should read --chamber 1.--.
Line 49, "is for" should read --is, for--.
Line 61, "predeterminded" should read --predetermined--.
Line 67, "valve and" should read --valve 13 and--.

COLUMN 3

Line 4, "high frequency" should read --high-frequency--.
Line 6, "high frequency" should read --high-frequency--.
Line 9, "on" should read --about--.
Line 10, "the predetermined" should read --a predetermined--.
Line 11, "partiality" should read --localization--.
Line 12, "the" should read --any one--.
Line 18, "gas introducing" should read --gas-introducing--.
Line 43, "vaccum" should read --vacuum--.
Line 43, "high" should read --high- --.
Line 49, "high" should read --high- --.

UNITED STATES PATENT AND TRADEMARK OFFICE
CERTIFICATE OF CORRECTION

PATENT NO. : 4,633,812

DATED : January 6, 1987

INVENTOR(S) : YASUTOMO FUJIYAMA

It is certified that error appears in the above-identified patent and that said Letters Patent is hereby corrected as shown below:

COLUMN 4

Line 16, "become" should read --became--.
Line 19, "vaccum" should read --vacuum--.
Line 30, "vaccum" should read --vacuum--.
Line 35, "material," should read --materials,--.

Signed and Sealed this

Twenty-second Day of September, 1987

Attest:

DONALD J. QUIGG

Attesting Officer

Commissioner of Patents and Trademarks